(12) United States Patent
Olgaard

(10) Patent No.: US 8,509,090 B2
(45) Date of Patent: Aug. 13, 2013

(54) APPARATUS AND METHOD FOR TESTING A WIRELESS TRANSCEIVER

(75) Inventor: Christian Volf Olgaard, Sunnyvale, CA (US)

(73) Assignee: Litepoint Corporation, Sunnyvale, CA (US)

( * ) Notice: Subject to any disclaimer, the term of this patent is extended or adjusted under 35 U.S.C. 154(b) by 313 days.

(21) Appl. No.: 11/867,467

(22) Filed: Oct. 4, 2007

(65) Prior Publication Data

US 2009/0092053 A1    Apr. 9, 2009

(51) Int. Cl.
*H04L 12/26* (2006.01)

(52) U.S. Cl.
USPC ........................................................ 370/241

(58) Field of Classification Search
USPC .................... 455/67.14, 67.16, 73; 375/370; 370/241
See application file for complete search history.

(56) References Cited

U.S. PATENT DOCUMENTS

| | | | |
|---|---|---|---|
| 4,833,676 A | 5/1989 | Koo | |
| 4,897,842 A | 1/1990 | Herz et al. | |
| 5,138,608 A | 8/1992 | Kucera et al. | |
| 5,910,977 A | 6/1999 | Torregrossa | |
| 6,154,638 A | 11/2000 | Cheng et al. | |
| 6,753,693 B2 | 6/2004 | Seo et al. | |
| 6,870,392 B2 | 3/2005 | Kilian et al. | |
| 6,915,113 B1 * | 7/2005 | Cardiff | 455/67.14 |
| 6,986,086 B2 | 1/2006 | Scholten | |
| 7,057,518 B2 | 6/2006 | Schmidt | |
| 7,099,424 B1 * | 8/2006 | Chang et al. | 375/370 |
| 7,463,140 B2 | 12/2008 | Schmidt | |
| 7,561,851 B2 * | 7/2009 | Shen et al. | 455/73 |
| 7,564,893 B2 | 7/2009 | O'Neill | |
| 7,890,822 B2 | 2/2011 | Behziz et al. | |
| 2005/0176376 A1 * | 8/2005 | Liu | 455/67.16 |
| 2005/0221765 A1 | 10/2005 | Shen et al. | |

FOREIGN PATENT DOCUMENTS

KR    10-2006-0103015    9/2006

OTHER PUBLICATIONS

International Search Report for International Application No. PCT/US08/76822 dated Dec. 19, 2008, 3 pp.
Written Opinion for International Application No. PCT/US08/76822 dated Dec. 19, 2008, 3 pp.
Mexico Office Action for Appl. MX/a/2010/003549 Mailed Apr. 20, 2012, in Spanish With English Translation.

* cited by examiner

*Primary Examiner* — Mark Rinehart
*Assistant Examiner* — Gbemileke Onamuti

(57) ABSTRACT

An apparatus for testing a communication circuit includes a dynamic range module. The dynamic range module includes signal strength adjustment module and a control module. The signal strength adjustment module adjusts a peak signal strength of test packets transmitted according to a predetermined test sequence. The control module selectively controls the signal strength adjustment module to adjust the peak signal strength based on the predetermined test sequence.

19 Claims, 10 Drawing Sheets

APPARATUS AND METHOD FOR TESTING A WIRELESS TRANSCEIVER

BACKGROUND

1. Field

The present disclosure relates to wireless communication systems, and more particularly to production testing of wireless communication systems.

2. Related Art

As the number and uses of wireless communication systems increase, it has become increasingly important to the manufacturers of such systems to perform production testing of the wireless transceivers embedded in such systems in a more time-efficient manner.

One way to minimize testing time is to employ a multiple packet testing technique such as disclosed in commonly owned U.S. patent application Ser. Nos. 11/422,475 and 11/422,489. When employing these techniques, both a device under test (DUT) and test equipment include a predetermined test flow, or sequence, to verify the performance of the DUT, which provides for simplified production testing. During testing, the DUT can transmit test packets according to the predetermined test flow and the test equipment can selectively capture desired packets based on the predetermined test flow.

A potential problem with these techniques can arise when the DUT needs to operate over a wide range of operating parameters such as multiple transmit/receive power levels and multiple modulation techniques. When these parameters are varied, the test equipment may not be able to measure the test packets with sufficient accuracy, which is undesirable. Accordingly there is a need to provide a method and apparatus that minimizes test time and that provides sufficient accuracy when testing wireless transceivers that operate over a wide range of operating parameters.

SUMMARY

In one example, an apparatus for testing a communication circuit includes a dynamic range module. The dynamic range module includes signal strength adjustment module and a control module. The signal strength adjustment module adjusts a peak signal strength of test packets transmitted according to a predetermined test sequence. The control module selectively controls the signal strength adjustment module to adjust the peak signal strength based on the predetermined test sequence. A related method is also disclosed.

In one example, the test module includes a vector signal analyzer that analyzes said test packets. In one example the test module includes a receiver, operatively coupled the vector signal analyzer, that is set to a predetermined gain.

In one example, the signal strength adjustment module adjusts the peak signal strength by attenuating the peak signal strength.

In one example, the dynamic range module includes a power detection module that detects the test packets. In one example, the control module controls the signal strength adjustment module based on the detected test packets. In one example, the control module counts test packets received.

In one example, the control module controls the signal strength adjustment module to adjust the peak signal strength of the test packets based on a change in power level according to the predetermined test sequence and/or a change in modulation according to the predetermined test sequence.

In one example, the control module controls the signal strength adjustment module to increase the peak signal strength when the power level is decreased according to the predetermined test sequence.

In one example, the control module controls the signal strength adjustment module to decrease the peak signal strength when the power level is increased according to the predetermined test sequence.

DETAILED DESCRIPTION

Figure 1:
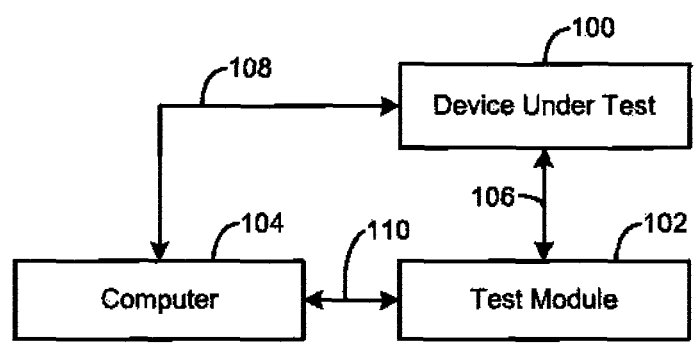
FIG. 1 is an exemplary functional block diagram of a test setup that includes a device under test, a test module, and a computer.

The following description of the embodiments is merely exemplary in nature and is in no way intended to limit the invention, its application, or uses. For purposes of clarity, the same reference numbers will be used in the drawings to identify similar elements. The embodiments are described in sufficient detail to enable one of ordinary skill in the art to practice the disclosure, and it will be understood that other embodiments may be practiced with some variations without departing from the spirit or scope of the subject invention.

As used herein, the term module, circuit and/or device refers to an Application Specific Integrated Circuit (ASIC), an electronic circuit a processor (shared, dedicated or group) and memory that execute one or more software or firmware programs, a combinational logic circuit, and/or other suitable components that provide the described functionality. Absent a clear indication to the contrary from the context it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described functionality. Additionally, the term "signal" may refer to one or more currents, one or more voltages, or a data signal. The phrase at least one of A, B, and C should be construed to mean a logical (A or B or C), using a nonexclusive logical or. Further, while the present disclosure has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Referring now to FIG. 1, a typical test setup includes a device under test (DUT) 100, a test module 102, and a computer 104. The DUT 100 is operatively coupled to the test module 102 and the computer 104 via interfaces 106 and 108, respectively. The test module 102 and the computer 104 are operatively coupled via interface 110.

As disclosed in commonly owned U.S. patent application Ser. Nos. 11/422,475 and 11/422,489, which are hereby incorporated by reference in their entirety, a test method using a predetermined test flow, or sequence, to verify the performance of the DUT 100 provides for simplified production testing and minimizes testing time. Both the test module 102 and the DUT 100 can include the predetermined test flow, or sequence, to verify the performance of the DUT 100, which provides for simplified production testing. During testing, the DUT 100 can transmit test packets according to the predetermined test flow and the test module 102 can selectively capture desired packets based on the predetermined test flow.

Figure 2:
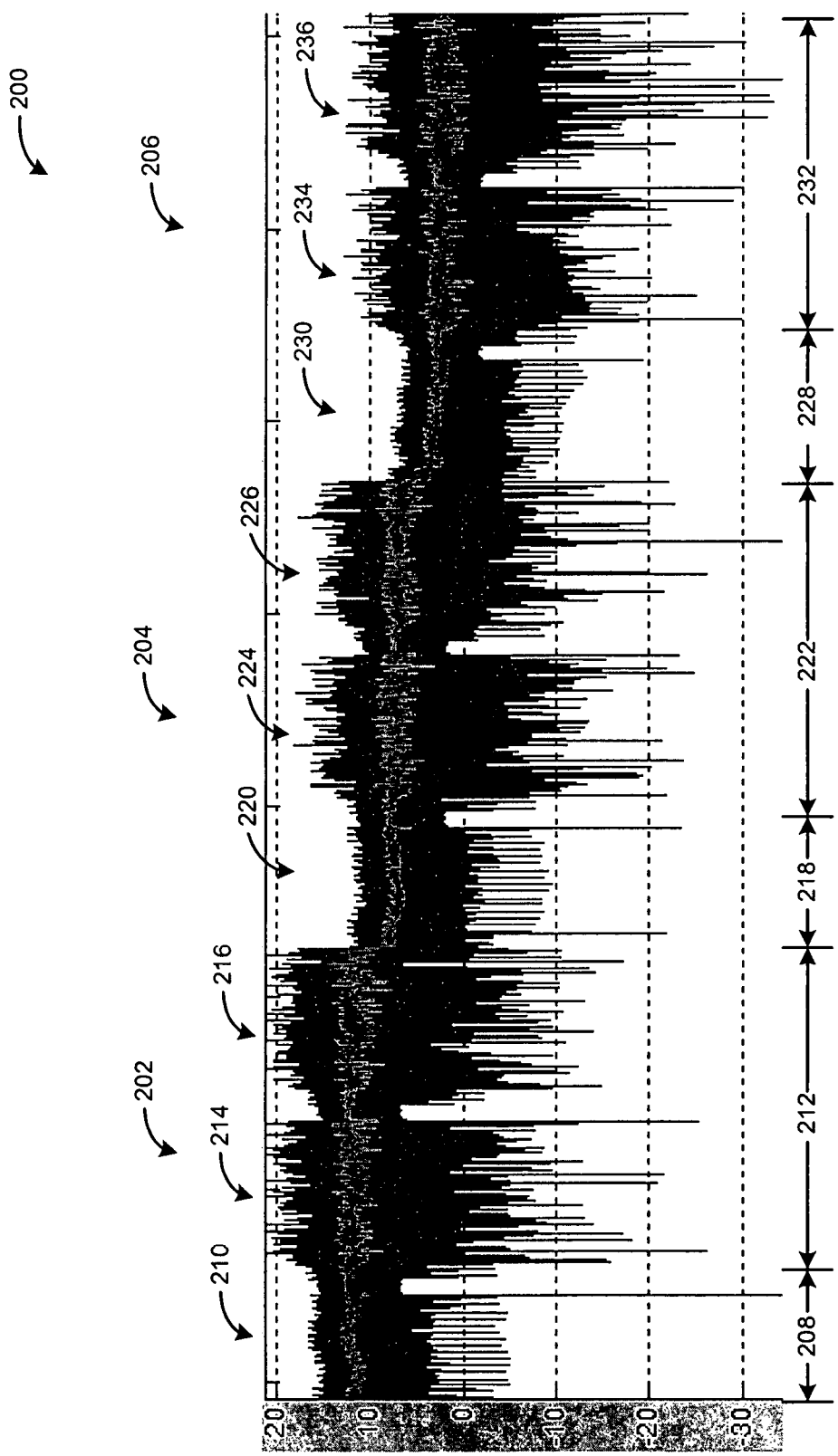
FIG. 2 is an exemplary timing diagram of one example of the test module capturing a predetermined test flow.

Referring now to FIG. 2, an exemplary timing diagram of one example of the test module 102 capturing a predetermined test flow is generally identified at 200. In this example, the test module 102 operates at a predetermined fixed gain in order to improve accuracy of the test measurements. The test module 102 receives and captures test packets transmitted by the DUT 100 at different predetermined power levels according to the predetermined test flow 200. More specifically, the DUT 100 transmits a first series of packets 202 at a first predetermined power level, a second series of packets 204 at a second predetermined power level, and a third series of packets 206 at a third predetermined power level. Although the predetermined test flow 200 includes tree series of packets in this example, skilled artisans will appreciate that more or less series packets can be used in accordance with the present disclosure.

During time interval 208, the test module 102 can capture one or more power measurements of packets 210 or portions of the packets 210, such as a long training sequence portion of an IEEE 802.11 signal, as shown in FIG. 2. In one example, the test module 102 can capture 7 μs portions of each of the 8 packets 210 and concatenate those captured portions. The power measurements can be averaged to determine an average power measurement for packets 210. During time interval 212, the predetermined test flow 200 can include packets 214, 216. As shown in FIG. 2, the test module 102 can capture packets 214, 216 in a concatenated form removing my time gaps between the packets due to the predetermined test flow. The test module 102 can analyze packets 214, 216 to determine modulation information such as error vector magnitude, phase mismatch, amplitude mismatch, and/or other suitable modulation information.

During time interval 218, the test module 102 can capture one or more power measurements of packets 220 or portions of the packets 220, such as a long training sequence portion of an IEEE 802.11 signal, as shown in FIG. 2. In one example, the test module 102 can capture 7 μs portions of each of the 8 packets 220 and concatenate those captured portions. The power measurements can be averaged to determine an average power measurement for packets 220. During time interval 222, the predetermined test flow 200 can include packets 224, 226. As shown in FIG. 2, the test module 102 can capture packets 224, 226 in a concatenated form removing any time gaps between the packets due to the predetermined test flow. The test module 102 can analyze packets 224, 226 to determine modulation information such as error vector magnitude, phase mismatch, amplitude mismatch, and/or other suitable modulation information.

During time interval 228, the test module 102 can capture one or more power measurements of packets 230 or portions of the packets 230, such as a long training sequence portion of an IEEE 802.11 signal, as shown in FIG. 2. In one example, the test module 102 can capture 7 μs portions of each of the 8 packets 230 and concatenate those captured portions. The power measurements can be averaged to determine an average power measurement for packets 230. During time interval 232, the predetermined test flow 200 can include packets 234, 236. As shown in FIG. 2, the test module 102 can capture packets 234, 236 in a concatenated form removing any time gaps between the packets due to the predetermined test flow. The test module 102 can analyze packets 234, 236 to determine modulation information such as error vector magnitude, phase mismatch, amplitude mismatch, and/or other suitable modulation information.

In order to increase relative accuracy of the power measurement it is desirable to operate the test module 102 at a predetermined constant gain. However, as shown, the predetermined sequence 200 includes a wide range of peak signal strengths (e.g., packets 202, 204, 260), which can reduce the accuracy of the power and/or modulation measurements when the test module 102 is operating at the predetermined constant gain.

Figure 3:
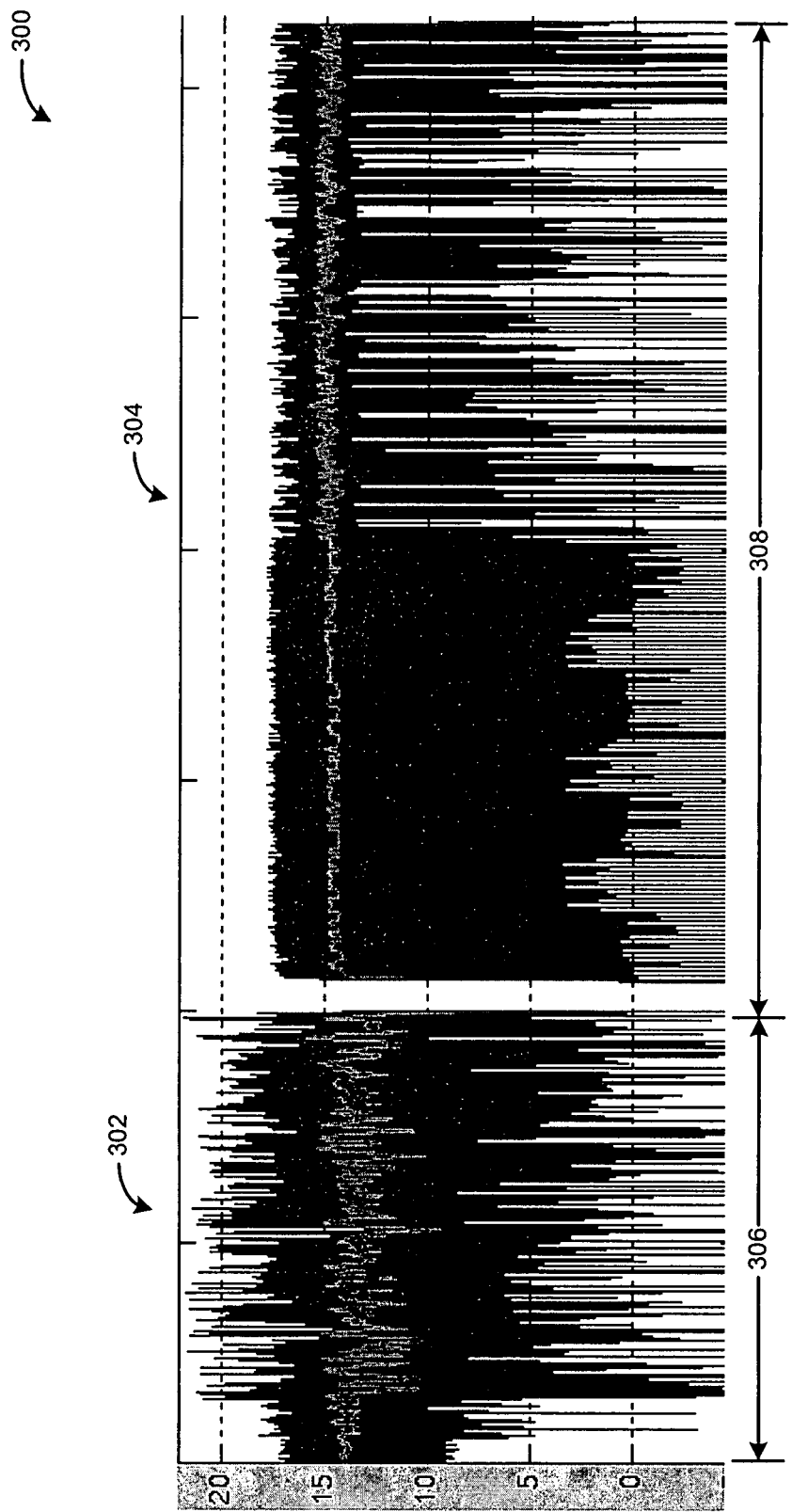
FIG. 3 is an exemplary timing diagram of another example of the test module capturing a predetermined test flow.

Referring now to FIG. 3, an exemplary timing diagram of another example of the test module 102 capturing a predetermined test flow is generally identified at 300. As with the previous example, the test module 102 operates at a predetermined fixed gain in order to improve accuracy of the test measurements. The test module 102 receives test packets transmitted by the DUT 100 at different predetermined modulations according to the predetermined test flow 300. In this example, the DUT 100 transmits one or more packets 302 using orthogonal frequency division multiplexing (OFDM) and one or more packets 304 using direct sequence spread spectrum (DSSS). Although, packets 302 and 304 are modulated using OFDM and DSSS in this example, other modulation techniques can be used if desired.

During time interval 306, the test module 102 can analyze one or more packets 302 to determine modulation information such as spectral mask, error vector magnitude, phase mismatch, amplitude mismatch, and/or other suitable modulation information for the first modulation type (e.g., OFDM). During time interval 308, the test module 102 can analyze one or more packets 304 to determine modulation information such as spectral mask, error vector magnitude, phase mismatch, amplitude mismatch, and/or other suitable modulation information for the second modulation type (e.g., DSSS).

As shown, the dynamic range of the predetermined test flow 300 is reduced by 5-6 dB when the modulation changes form OFDM to DSSS. This reduction effectively increases the noise floor of the test module 102 when measuring DSSS signals, which adversely affects spectral mask measurements by the test module 102.

One way to improve the accuracy of the power and modulation measurements discussed in FIGS. 2 and 3 is to vary the gain of the test module 102 based on the predetermined test flow. For example, the test module 102 can vary its gain based on an anticipated change in the power level the DUT 100 uses to transmit a test packet according to the predetermined test flow. More specifically, the test equipment can increase its gain in anticipation of the DUT 100 decreasing the power level used to transmit a test packet and decrease its gain in anticipation of the DUT 100 increasing the power level used to transmit a test packet. In addition, the test module 102 can vary its gain based on an anticipated change in modulation of a test packet according to the predetermined test flow. For example, the test module 102 can increase its gain in anticipation of the DUT 100 changing from OFDM to DSSS and decrease its gain in anticipation of the DUT 100 changing from DSSS to OFDM.

However, the time required to adjust the gain of the test module 102 may take too long to vary the gain according to different packet types of the predetermined test flow. One way to overcome this problem is to increase DUT 100 transmit time for each type of packet in the predetermined test flow, which is undesirable since the overall test time will also increase. In addition, some DUT, such as those that operate according to IEEE 302.11, are not designed to operate in a time synchronous manner, which affects the ability to accurately control the transmit time duration of each type of packet in the predetermined test flow.

Figure 4:
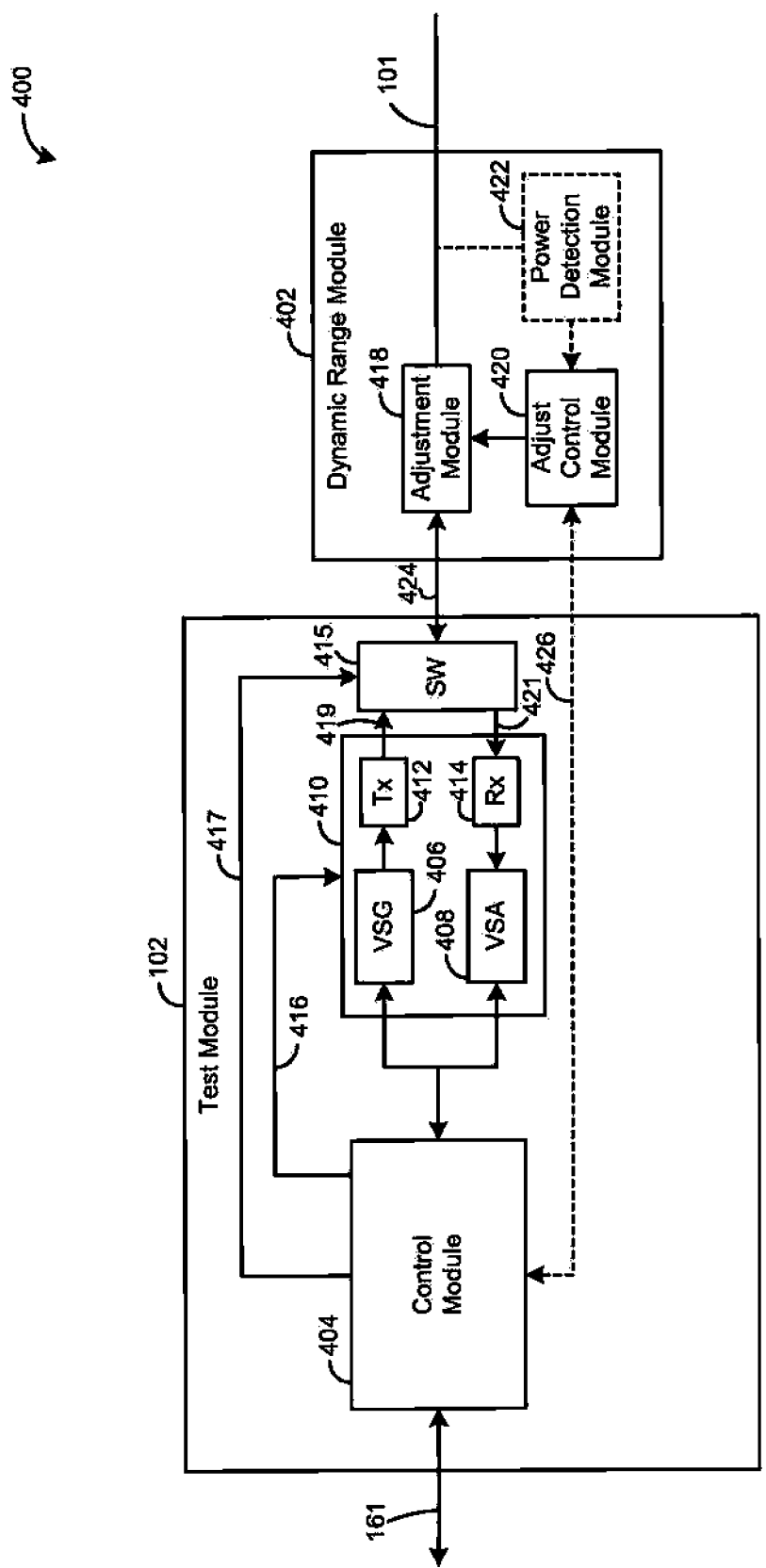
FIG. 4 is an exemplary functional block diagram of an improved test instrument that includes the test module and a dynamic range module.

Referring now to FIG. 4, an improved test instrument 400 capable of varying the peak signal strength (e.g., gain) of test packets is depicted. The test instrument 400 includes the test module 102 and a dynamic range module 402. The test module 102 includes a test control module 404 that includes the predetermined test flow, a transceiver module 410 that includes a vector signal generator (VSG) 406, a vector signal analyzer (VSA) 408, a transmitter 412 and receiver 414. The control module 402 is operatively coupled to the VSG 406, the VSA 408, the transceiver module 410, and the computer 150 (via path 161). The VSG 406 is operatively coupled to the transmitter 412 and the VSA 408 is operatively coupled to the receiver 414 The transmitter 412 and receiver 414 are operatively coupled to a switch 415, which can be controlled via signal 417 to selectively pass a transmit or receive signal. In addition, the test control module 404 sends an adjust gain signal 416 to set the gain of the transceiver module 410 to a predetermined fixed gain.

The dynamic range module 402 includes an adjustment module 418, an adjustment control module 420, and in some embodiments a power detection module 422. The adjustment module 418 is operatively coupled to the transceiver module 410 via path 424, the DUT 100 via path 101, and the adjustment control module 420. In embodiments with the power detection module 422, the control module 420 is operatively coupled to the power detection module 422, which is operatively coupled to the DUT 100 via path 101.

During operation, the DUT 100 transmits one or more test packets based on the predetermined test flow to the dynamic range module 402 via path 101. The adjustment control module 420 anticipates changes in power and/or modulation used by the DUT 100 to transmit the test packets by tracking the predetermined test flow. In this manner, the adjustment control module 420 selectively controls the adjustment module 418 to adjust a peak signal strength of the test packets received via path 101 based on the predetermined test flow. In some embodiments, the predetermined test flow can be included in the adjustment control module 420. In other embodiments, the test control module 404 can communicate the predetermined test flow to the adjustment control module 420 via path 426. In yet other embodiments, the test control module 404 can control the adjustment module 418 directly.

As previously noted, the test control module 404 can set the transceiver module 410 to a predetermined fixed gain. Therefore, in some embodiments, the predetermined fixed gain can be set to a maximum gain for the dynamic range of the test packets used in the predetermined test flow. The adjustment control module 420 can selectively control the adjustment module 418 to attenuate the peak signal strength of the test packets according to the predetermined test flow. Accordingly, in these embodiments, the adjustment module 418 can be any known attenuation circuit, such as a solid state attenuation circuit, having a quick attenuation response time.

In other embodiments, the adjustment module 418 can include multiple gain stages. For example, one gain stage can be set to a constant gain and operatively coupled to multiple attenuator stages in order to yield an overall positive gain.

The power detection module 422 can be used to detect whether the peak signal strength of the test packets received from the DUT 100 has increased or decreased. Accordingly, when the power detection module 422 does not detect a signal strength, the DUT 100 has not transmitted a test packet. Therefore, the adjustment control module 420 need not control the adjustment module 418 when the power detection module 422 does not detect a signal strength (e.g., receive a test packet) if desired. In some embodiments, the power detection module 422 can be used to count acknowledgement packets during a packet error rate test or sensitivity test as disclosed in commonly owned U.S. patent application Ser. Nos. 11/839,828 and 11/839,814, which are hereby incorporated by reference in their entirety.

Figure 5:
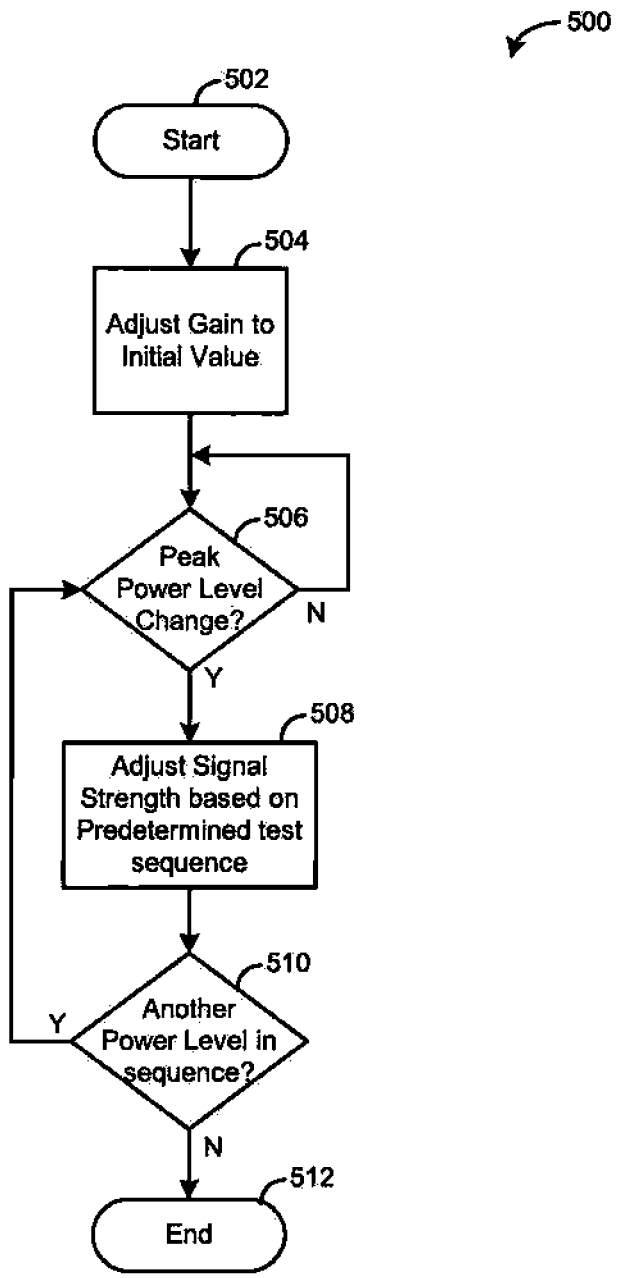
FIG. 5 is a flowchart depicting exemplary steps that can be taken by the test instrument when capturing packets according to the predetermined test flow of FIG. 2.

Referring now to FIG. 5, exemplary steps that can be taken by the test instrument 400 when performing a test such as the predetermined test flow 200 depicted in FIG. 2 are generally identified at 500. The process starts in step 502 when the predetermined test is initialized (e.g., the predetermined test flow of the test instrument 400 and DUT 100 are synchronized). In step 504, the test control mole 404 adjusts the gain of the transceiver module 410 to a predetermined fixed gain (e.g., a maximum gain for the dynamic range of the test packets used in the predetermined test flow). In step 506, the adjustment control module 420 determines whether there is a change in a peak power level of the test packets transmitted by the DUT 100 based on the predetermined test flow. More specifically, the adjustment control module 420 determines whether, according to the predetermined test flow (e.g, by tracking the predetermined test flow), the DUT 100 is to transmit test packets at a different power level than the DUT 100 is currently transmitting test packets.

If the adjustment control module 420 determines that there is not a change in power level of the next test packets, the process returns to step 506. However, if the adjustment control module 420 determines that there will be a change in power level of the test packets, the adjustment control module 420 controls the adjustment module 418 to adjust the peak signal strength of the test packets according to the change in power level in step 508. For example, if the change in power level is a decrease in power level, the adjustment control module 420 controls the adjustment module to increase the peak signal strength of the test packets received by the VSA 408. In addition, if the change in power level is an increase in power level, the adjustment control module 420 controls the adjustment module to decrease the peak signal strength of the test packets.

In step 510, the adjustment control module 420 determines whether there is another power level to be tested in the predetermined test flow. If there is another power level to be tested in the predetermined test flow, the process returns to step 506. If there is not another power level to be tested in the predetermined test flow, the process ends in step 512.

Figure 6:
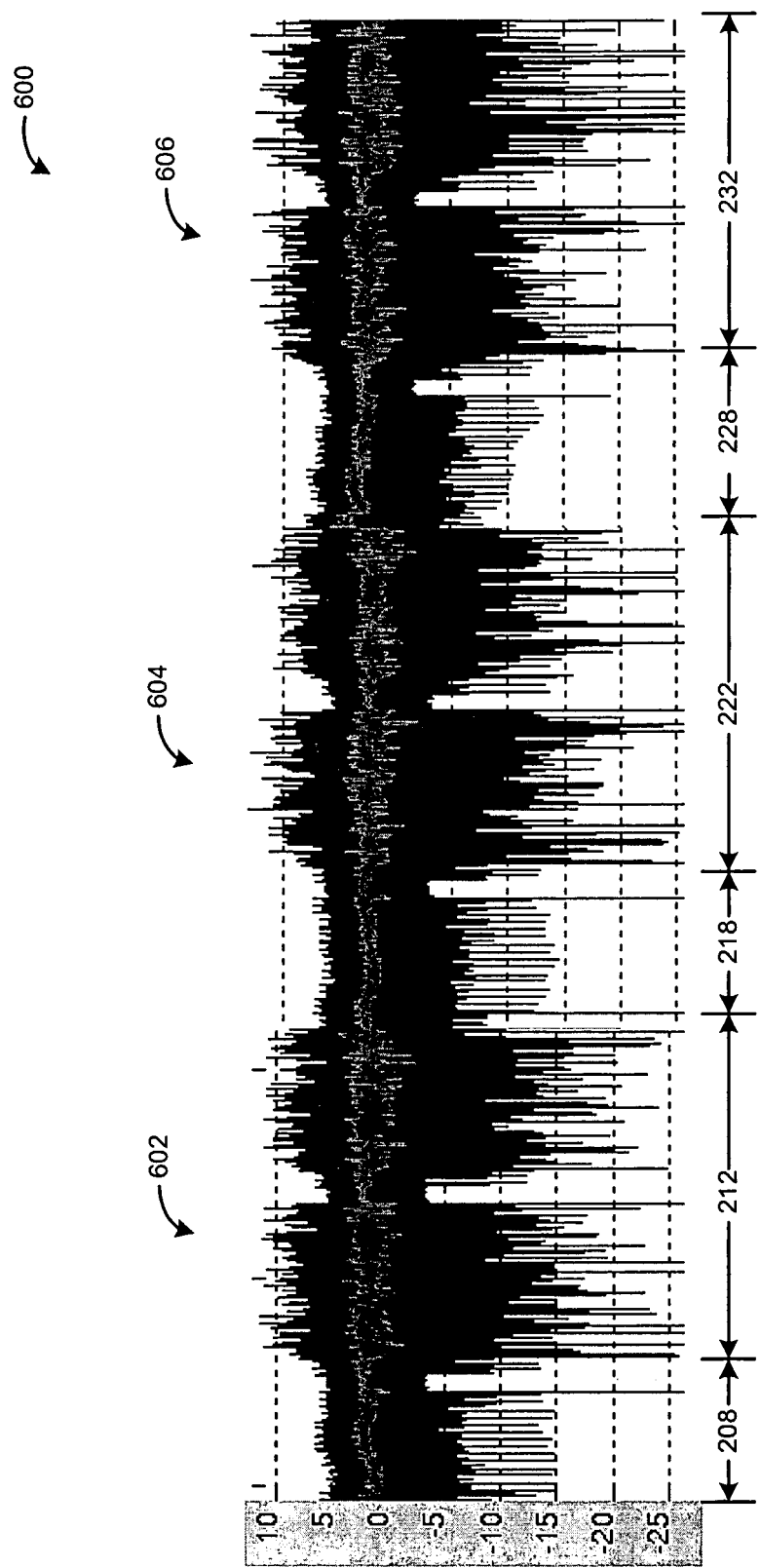
FIG. 6 is an exemplary timing diagram of one example of the test instrument capturing the predetermined test flow of FIG. 2.

Referring now to FIG. 6, an exemplary timing diagram of one example of the test instrument 400 capturing the predetermined test flow 200 of FIG. 2 is generally identified at 600.

In this example, the test module 102 operates at a predetermined fixed gain while the dynamic range module 402 selectively adjusts the peak signal strength of the test packets based on the predetermined test flow. The test instrument 400 receives test packets transmitted by the DUT 100 at different predetermined power levels according to the predetermined test flow 200. More specifically, the DUT 100 transmits a first series of packets 602 at a first predetermined power level, a second series of packets 604 at a second predetermined power level, and a third series of packets 606 at a third predetermined power level. As shown the dynamic range module 402 selectively adjusts the peak signal strength of the test packets 602, 604, 606 so that the power level of the test packets received by the test module 102 have approximately the same peak signal strength.

Figure 7:
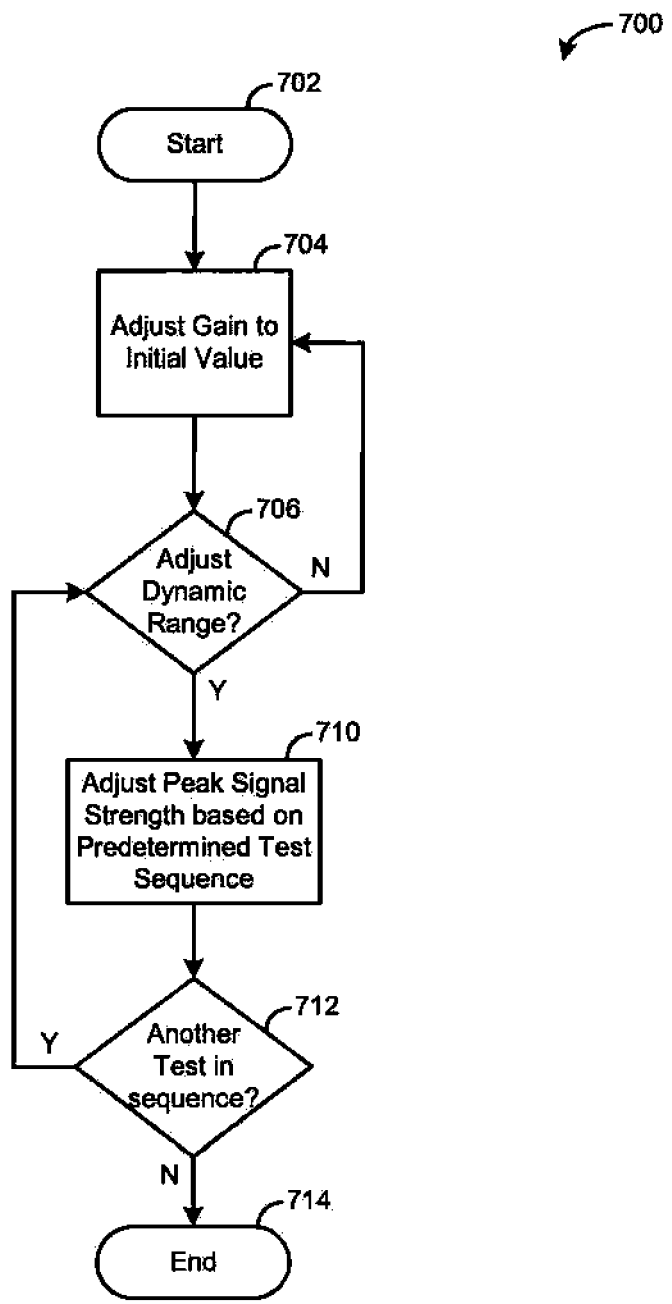
FIG. 7 is a flowchart depicting alternate exemplary steps that can be taken by the test instrument when capturing packets according to the predetermined test flow of FIG. 2.

Referring now to FIG. 7, alternate exemplary steps that can be taken by the test instrument 400 when performing a test such as the predetermined test flow 200 depicted in FIG. 2 are generally identified at 700. The process starts in step 702 when the predetermined test is initialized (e.g., the predetermined test flow of the test instrument 400 and DUT 100 are synchronized). In step 704, the test control module 404 adjusts the gain of the transceiver module 410 to a predetermined fixed gain (e.g., a maximum or minimum gain for the dynamic range of the test packets used in the predetermined test flow). In step 706, the adjustment control module 420 determines whether the current test of the predetermined test flow requires the dynamic range to be adjusted. For example, in some embodiments, the test instrument 400 can use a predetermined fixed gain to capture one or more packets when measuring power such as during time intervals 208, 212, 228 of FIG. 2. In addition, in some embodiments, the test instrument 400 can adjust the peak signal strength of one or more packets when analyzing the packets to determine modulation information such as error vector magnitude, phase mismatch, amplitude mismatch, and/or other suitable modulation information during time intervals 212, 222, 232 of FIG. 2.

If the adjustment control module 420 determines that the current test of the predetermined test flow does not require the disc range to be adjusted, the process returns to step 706. However, if the adjustment control module 420 determines that the current test of the predetermined test flow does not require the dynamic range to be adjusted relative to the initial dynamic range, the adjustment control module 420 controls the adjustment module 418 to adjust the peak signal strength of the test packets according to the change in modulation in step 710.

In step 712, the adjustment control module 420 determines whether the predetermined test flow includes another test. If there is another test according to the predetermined test flow, the process returns to step 706. If there is not another test in the predetermined test flow, the process ends in step 714.

Figure 8:
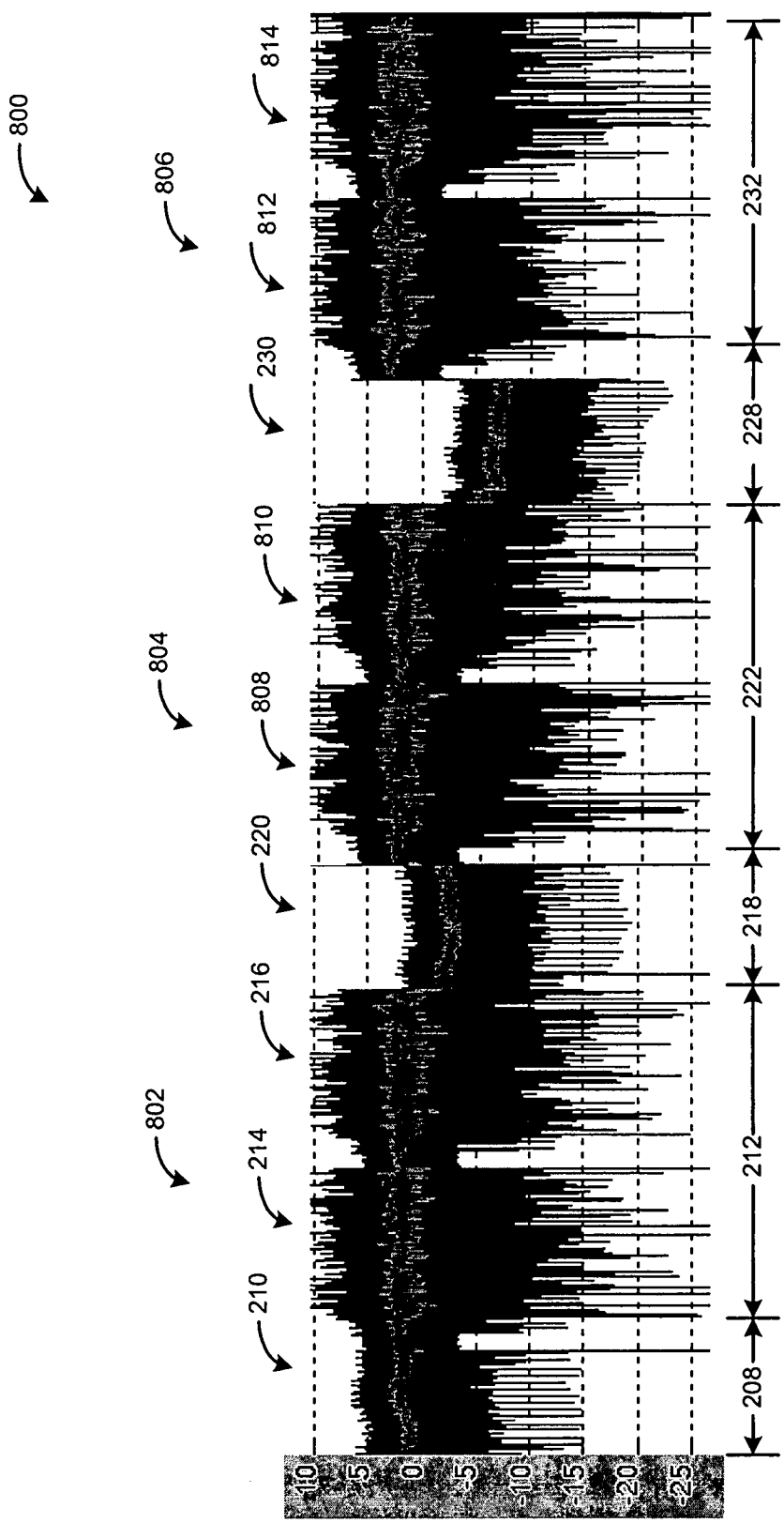
FIG. 8 is an exemplary timing diagram of the test intent capturing packets using the steps of FIG. 7.

Referring now to FIG. 8, an exemplary timing diagram of the test instrument 400 capturing the predetermined test flow 200 of FIG. 2 according to the steps of FIG. 7 is generally identified at 800. In this example, the test module 102 operates at a predetermined fixed gain while the dynamic range module 402 selectively adjusts the peak signal strength of the test packets based on the predetermined test flow. The test instrument 400 receives test packets transmitted by the DUT 100 at different predetermined power levels according to the predetermined test flow 200. More specifically, the DUT 100 transmits a first series of packets 802 at a first predetermined power level, a second series of packets 804 at a second predetermined power level, and a third series of packets 806 at a third predetermined power level. As shown, the dynamic range module 402 selectively adjusts the peak signal strength of test packets 808, 810, 812, 814 to have approximately the same peak signal strength of packets 214, 216. In addition, in this example, the dynamic range module 402 does not adjust packets 210, 220, 230 so that the test module 102 can capture the test packets with a constant gain, which is useful in determining a relative accuracy. The relative accuracy can be used, for example, to calibrate the transmit power of the DUT 100 without introducing errors from gain changes that would exist when normalizing input power to a maximum signal to noise ratio.

Figure 9:
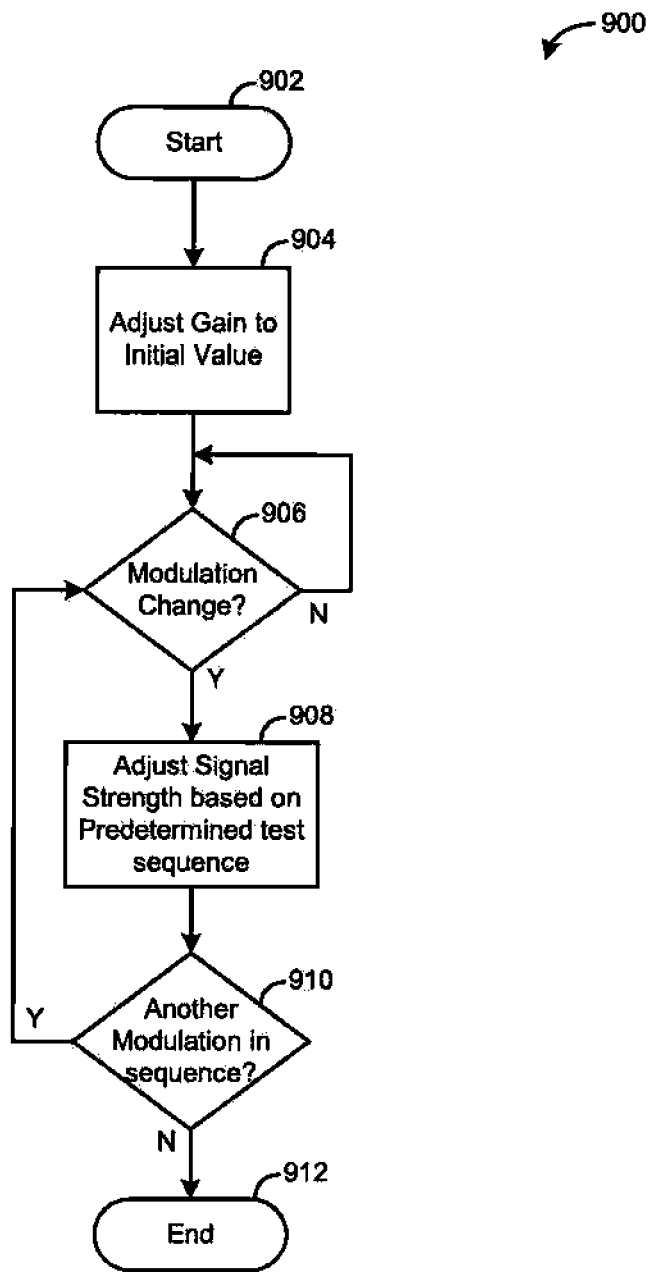
FIG. 9 is a flowchart depicting exemplary steps that can be taken by the test instrument when capturing packets according to the predetermined test flow of FIG. 3.

Referring now to FIG. 9, exemplary steps that can be taken by the test instrument 400 when performing a test such as the predetermined test flow 300 depicted in FIG. 3 are generally identified at 900. The process starts in step 902 when the predetermined test is initialized (e.g., the predetermined test flow of the test instrument 400 and DUT 100 are synchronized). In step 904, the test control module adjusts the gain of the transceiver module 410 to a predetermined fixed gain (e.g., a maximum gain for the dynamic range of the test packets used in the predetermined test flow). In step 906, the adjustment control module 420 determines whether there is a change in modulation (e.g., OFDM to DSSS or vice versa) of the test packets transmitted by the DUT 100 based on the predetermined test flow. More specifically, the adjustment control module 420 determines whether, according to the predetermined test flow, the DUT 1 to is to transmit test packets using pa different modulation technique than the DUT 100 is currently transmitting test packets.

If the adjustment control module 420 determines that there is not a change in modulation of the test packets, the process returns to step 906. However, if the adjustment control module 420 determines that there is a change in modulation (e.g., OFDM to DSSS or vice versa) of the test packets, the adjustment control module controls the adjustment module 418 to adjust the peak signal strength of the test packets according to the change in modulation in step 910. For example, if the change in modulation is from OFDM to DSSS, the adjustment control module 420 controls the adjustment module to increase the peak signal strength of the test packets. However, if the change in modulation is from DSSS to OFDM, the adjustment control module 420 controls the adjustment module to decrease the peak signal strength of the test packets.

In step 910, the adjustment control module 420 determines whether there is another change in modulation in the predetermined test flow. If the is another change in modulation in the predetermined test flow, the process returns to step 906. If there is not another change in modulation in the predetermined test flow, the process ends in step 914.

Figure 10:
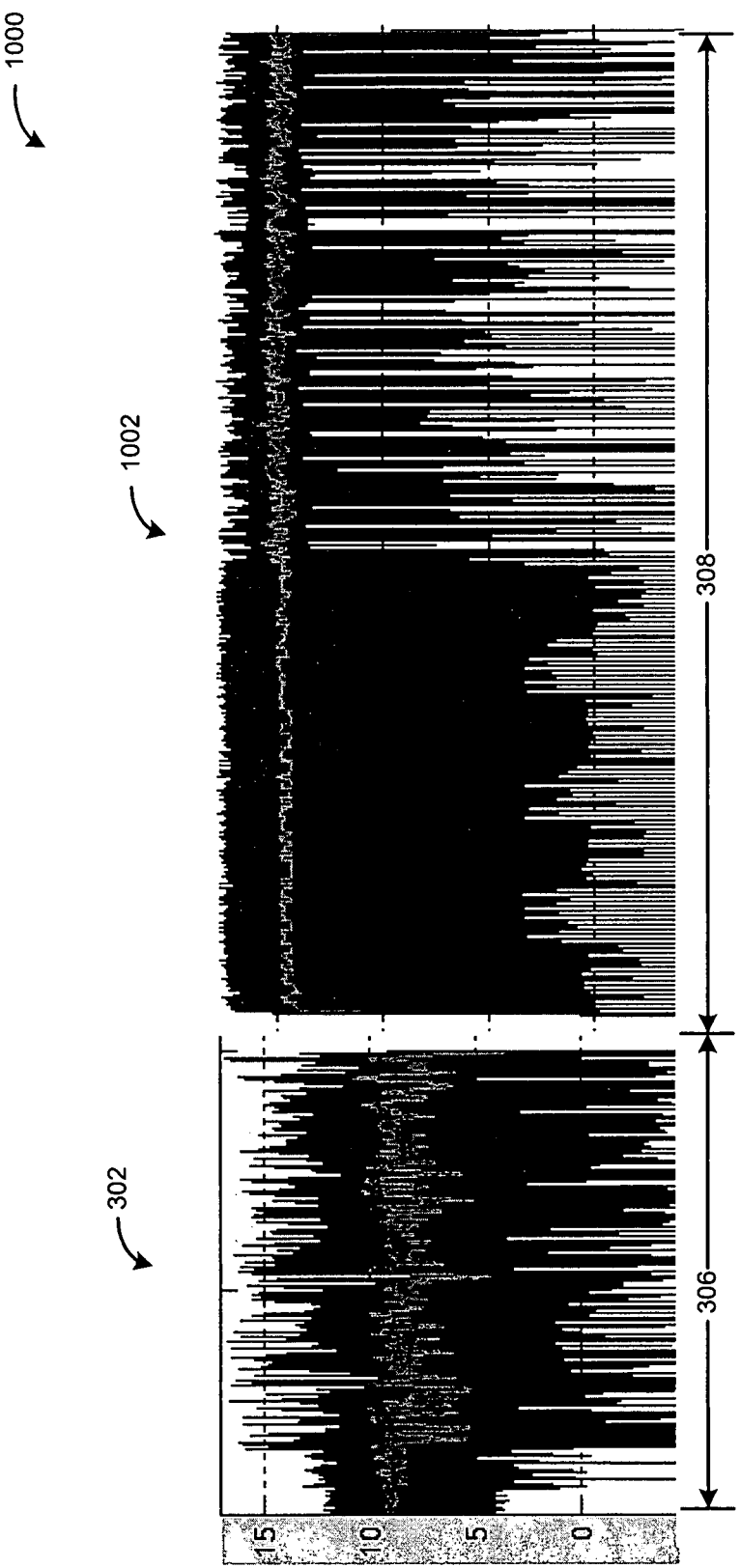
FIG. 10 is an exemplary timing diagram of the test instrument capturing packets according to the predetermined test flow of FIG. 3.

Referring now to FIG. 10, an exemplary timing diagram of the test instrument 400 capturing the predetermined test flow 300 of FIG. 3 is generally identified at 1000. In this example, the test module 102 operates at a predetermined fixed gain while the dynamic range module 402 selectively adjusts the peak signal strength of the test packets based on the predetermined test flow. The test instrument 400 receives test packets transmitted by the DUT 100 using different modulation techniques such as OFDM and DSSS according to the predetermined test flow 200. More specifically, in this example, the DUT 100 transmits a first series of packets 302 using OFDM and a second series of packets 1002 using DSSS. As shown, the dynamic range module 402 selectively adjusts the peak signal strength of test packets 1002 to have approximately the same peak signal strength as packets 302. Therefore, the peak signal strength of packets 1002 is effectively increased with respect to packets 302 optimizing the dynamic range and providing an improved measurement to determine the spectral mask of the DUT 100.

As noted above, among other advantages, by pre-programming a wireless transceiver with a predetermined test flow, testing time can be reduced which minimizes production costs. Furthermore, by varying the peak signal strength of test packets more or less instantaneously based on the predetermined test flow, the dynamic range of test measurements can be optimized, which can improve the accuracy of power and/or modulation test measurements. Other advantages will be recognized by those of ordinary skill in the art.

Various other modifications and alternations in the structure and method of operation of his invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus for testing an upstream communication circuit, comprising:
   a dynamic range module that comprises:
      a signal strength adjustment module that is operative to adjust a peak signal strength of individual ones of received test packets that have been transmitted by said communication circuit according to a predetermined test sequence; and
      a control module that is operative to selectively control said signal strength adjustment module based on said predetermined test sequence;
   wherein said predetermined test sequence includes said adjustment of said peak signal strength following at least one of a predetermined time interval and a predetermined number of test packets.

2. The apparatus of claim 1 further comprising a test module that is includes a vector signal analyzer that is operative to analyze said test packets.

3. The apparatus of claim 2 further comprising a receiver operatively coupled to the vector signal analyzer, wherein the receiver is set to a predetermined gain.

4. The apparatus of claim 1 wherein said signal strength adjustment module is operative to adjust said peak signal strength by attenuating said peak signal strength.

5. The apparatus of claim 1 wherein said dynamic range module includes a power detection module that is operative to detect said test packets.

6. The apparatus of claim 5 wherein said control module is operative to control said signal strength adjustment module based on said detected test packets.

7. The apparatus of claim 5 wherein said control module is operative to count said test packets received.

8. The apparatus of claim 1 wherein said control module is operative to control said signal strength adjustment module based on at least one of a change in power level according to said predetermined test sequence and a change in modulation according to said predetermined test sequence.

9. The apparatus of claim 8 wherein said control module is operative to control said signal strength adjustment module such that said peak signal strength is increased when said power level is decreased according to said predetermined test sequence.

10. The apparatus of claim 8 wherein said control module is operative to control said signal strength adjustment module such that said peak signal strength is decreased when said power level is increased according to said predetermined test sequence.

11. A method for testing an upstream communication circuit, comprising:
   receiving, with a dynamic range module, test packets that have been transmitted by said communication circuit according to a predetermined test sequence; and
   selectively adjusting, with said dynamic range module, a peak signal strength of individual ones of said test packets based on said predetermined test sequence;
   wherein said predetermined test sequence includes said adjustment of said peak signal strength following at least one of a predetermined time interval and a predetermined number of test packets.

12. The method of claim 11 further comprising performing analyzing said test packets.

13. The method of claim 11 wherein said peak signal strength is adjusted by attenuating said peak signal strength.

14. The method of claim 11 further comprising detecting said peak signal strength of said test packets.

15. The method of claim 14 further comprising adjusting said peak signal strength based on said test packets.

16. The method of claim 14 further comprising counting said test packets received.

17. The method of claim 11 further comprising adjusting said peak signal strength of said test packets based on at least one of a change in power level according to said predetermined test sequence and a change in modulation according to said predetermined test sequence.

18. The method of claim 17 further comprising increasing said peak signal strength when said power level is decreased according to the predetermined test sequence.

19. The method of claim 17 further comprising decreasing said peak signal strength when said power level is increased according to the predetermined test sequence.

* * * * *

UNITED STATES PATENT AND TRADEMARK OFFICE
CERTIFICATE OF CORRECTION

PATENT NO.        : 8,509,090 B2
APPLICATION NO.   : 11/867467
DATED             : August 13, 2013
INVENTOR(S)       : Christian Volf Olgaard It is certified that error appears in the above-identified patent and that said Letters Patent is hereby corrected as shown below:

In the Specifications:

Column 1, line 18: delete "Ser." that precedes the words "Nos. 11/422,475".

Column 2, line 31: From the description of Figure 8, delete the word "intent" and replace it with "instrument".

Column 2, line 53: add a "," following the words "electronic circuit" and "dedicated".

In column 2, line 57: add a "," following the word "context".

In column 3, line 14: capitalize the first letter of the words "patent application".

In column 3, line 15: delete the abbreviation "Ser." and replace with "Serial".

In column 3, line 38: delete the word "tree" and replace with "three".

In column 3, line 52: delete the word "my" and replace with "any".

In column 4, line 56: delete the words "5-6 dB" and replace with "5-6dB".

In column 4, line 57: delete the word "form" and replace with "from".

In column 5, line 18: delete the number "302.11" and replace with "802.11".

In column 6, line 23: delete the abbreviation "Ser.".

In column 6, line 23: capitalize the first letter of the words "patent application".

Signed and Sealed this
Eighth Day of October, 2013

Teresa Stanek Rea
*Deputy Director of the United States Patent and Trademark Office*

CERTIFICATE OF CORRECTION (continued)
U.S. Pat. No. 8,509,090 B2

In column 6, line 32: delete the word "mole" and replace with "module".

In column 7, line 11: add a "," following the words "As shown".

In column 7, line 41: delete the word "disc" and replace with "dynamic".

In column 8, line 28: delete the words "DUT 1 to" and replace with "DUT 100".

In column 8, line 29: delete the word "pa" and replace with "a".